United States Patent [19]

Baillargeon et al.

[11] Patent Number: 5,633,193

[45] Date of Patent: May 27, 1997

[54] METHOD OF MAKING AN INP-BASED DEVICE COMPRISING SEMICONDUCTOR GROWTH ON A NON-PLANAR SURFACE

[75] Inventors: James N. Baillargeon, Springfield; Alfred Y. Cho, Summit; Sung-Nee G. Chu, Murray Hill; Wen-Yen Hwang, Westfield, all of N.J.

[73] Assignee: Lucent Technologies Inc., Murray Hill, N.J.

[21] Appl. No.: 652,285

[22] Filed: May 22, 1996

[51] Int. Cl.$^6$ ............................................. H01L 21/20
[52] U.S. Cl. .............................. 438/32; 438/43; 438/44; 117/953; 117/108
[58] Field of Search ........................ 437/247, 248, 437/249, 943, 982, 133, 107

[56] References Cited

U.S. PATENT DOCUMENTS

| 4,674,100 | 6/1987 | Kobayashi | 372/50 |
|---|---|---|---|
| 4,885,262 | 12/1989 | Ting et al. | 437/248 |
| 5,126,281 | 6/1992 | Carey et al. | 437/247 |
| 5,360,763 | 11/1994 | Nakamura | 437/129 |
| 5,387,546 | 2/1995 | Meada et al. | 437/943 |
| 5,399,521 | 3/1995 | Celic et al. | 437/133 |

OTHER PUBLICATIONS

"Evaluation of the Performance and Operating Characteristics of a Solid Phosphorous Source Valved Cracking Cell for Molecular Beam Epitaxy Growth of III–V Compounds", by J.N. Baillargeon et al., *Journal of Vacuum Science and Technology*, vol. B 13(1), p. 64 (Jan./Feb. 1995).

*Primary Examiner*—R. Bruce Breneman
*Assistant Examiner*—Ramamohan Rao Paladugu
*Attorney, Agent, or Firm*—Eugen E. Pacher

[57] ABSTRACT

Heteroepitaxial growth of phosphorus-containing III/V semiconductor material (e.g., InGaAsP) on a non-planar surface of a different phosphorus-containing III/V semiconductor material (e.g., InP) is facilitated by heating the non-planar surface in a substantially evacuated chamber to a mass-transport temperature, and exposing the surface to a flux of at least phosphorus form a solid phosphorus source. This mass-transport step is followed by in situ growth of the desired semiconductor material, with at least an initial portion of the growth being done at a first growth temperature that is not greater than the mass transport temperature. Growth typically is completed at a second growth temperature higher than the first growth temperature. A significant aspect of the method is provision of the required fluxes (e.g., phosphorus, arsenic, indium, gallium) from solid sources, resulting in hydrogen-free mass transport and growth, which can be carried out at lower temperatures than is customary in the prior art. An exemplary and preferred application of the method is in grating formation and overgrowth in InP-based DFB lasers.

9 Claims, 3 Drawing Sheets

# METHOD OF MAKING AN INP-BASED DEVICE COMPRISING SEMICONDUCTOR GROWTH ON A NON-PLANAR SURFACE

FIELD OF THE INVENTION

This invention pertains to making InP-based distributed feedback (DFB) lasers and other InP-based semiconductor devices.

BACKGROUND OF THE INVENTION

DFB lasers typically comprise a "grating" that serves to determine and stabilize the laser wavelength. The grating exemplarily is formed by a process that involves deposition of a conventional resist layer on the surface of a III/V semiconductor wafer, patterning of the resist layer, and etching of the exposed portions of the semiconductor surface. After removal of the resist, III/V semiconductor material of desired composition and thickness is deposited on the thus created "corrugated" semiconductor surface, and laser manufacture is completed. The grating can be disposed below or above the active layer of the laser.

Much effort has gone into devising manufacturing processes that can reproducibly provide high quality overgrowth on gratings of predetermined shape and depth, with the growth surface being smooth and plane after growth of only a few tens of nanometers. However, the results have to date not been completely satisfactory. This is especially true of ternary and quaternary III/V semiconductor materials which typically have different growth rates and compositions associated with surfaces of different crystalline orientation.

Because laser characteristics are strongly dependent on the details of the grating profile and the spacing between grating and active region, any significant wafer-to-wafer (or chip-to-chip) variation in the grating profile and/or spacing results in undesirable variations in coupling coefficiency, frequently negatively impacting device yield.

In view of the obvious advantage of being able to produce DFB lasers with high yield, it would be highly desirable to have available a manufacturing method that can repeatably provide a desired laser structure, including the grating and the layers grown thereon. This application discloses such a method.

The growth of semiconductor material on a corrugated semiconductor surface is an example of a wider processing task, namely, the growth of compound semiconductor material on a non-planar semiconductor surface. The need for such growth arises, for instance, in the manufacture of some photonic and electronic devices or integrated circuits, e.g., in the manufacture of lasers integrated with modulators.

Although the method that is disclosed herein can advantageously be used in the manufacture of a variety of InP-based semiconductor devices involving growth of compound semiconductor material on a non-planar substrate, the method will be described below in tens of a specific and important embodiment, namely, the manufacture of InP-based DFB lasers involving the growth of ternary or quaternary III/V semiconductor material such as GaInAsP on a corrugated Inp surface, or the growth of InP on a corrugated ternary or quaternary III/V semiconductor (e.g., GaInAsP) surface.

By an "InP-based" device we mean a III/V semiconductor device formed by epitaxial growth on an InP substrate, or containing one or more layers of InP.

SUMMARY OF THE INVENTION

In a broad aspect the invention is embodied in a method of making an InP-based semiconductor device that involves heteroepitaxial growth of III/V semiconductor material on a non-planar III/V semiconductor surface.

More specifically, the method comprises providing an InP-based semiconductor body having a major surface, patterning the surface such that a surface with non-planar surface features results, and growing a phosphorus (P)-containing semiconductor material (e.g., GaInAsP or InP) on the patterned major surface. Subsequently one or more further steps (e.g., growth of one or more further layers of semiconductor material, metal deposition, heat treatment, cleaving, packaging, etc.) towards completion of the semiconductor device are carried out.

Significantly, the method comprises heating, in a substantially evacuated (background pressure typically $\leq 10^{-8}$ Torr) chamber, the semiconductor body with the non-planar surface features to a mass-transport temperature, and exposing, in the substantially evacuated chamber, the patterned major surface to a flux of at least phosphorus from a solid phosphorus flux source for a time effective for providing a shape change of the non-planar surface features by mass-transport; and furthermore comprises carrying out at least an initial portion of the growth step without exposing the semiconductor body to an ambient atmosphere, with the semiconductor body preferably being at a growth temperature that does not exceed said mass-transport temperature at least during said initial portion.

A significant feature of the method is the use of solid sources of P and, optionally, As, rather than the commonly used H-containing compounds of P and As (e.g., phosphene and arsine). This facilitates use of lower process temperatures, which in turn can result in less dopant diffusion and a more reproducible process, and thus in higher device yield.

Exposure of the surface to As during the mass transport step generally decreases the rate of mass transport (and thus of shape change), as compared to the rate when the surface is exposed to P only. The ratio of As flux to P flux thus will generally be selected to result in a desired rate of mass transport. Since this rate also depends on the temperature of the body, no general rule can be given. However, a minor amount of experimentation will generally suffice to determine a satisfactory ratio at any given temperature.

DETAILED DESCRIPTION OF THE EXEMPLARY EMBODIMENTS

Exemplary and technologically important devices that are advantageously made by the inventive method are Inp-based 1.3 μm and 1.55 μm DFB lasers. Such lasers find widespread use in, for instance, optical fiber communication systems. Manufacture of such lasers exemplarily requires growth of GaInAsP on a corrugated crystal (exemplarily InP) surface. See, for instance, G. P. Agrawal et at., "Semiconductor Lasers", 2nd ed., Van Nostrand Reinhold, New York 1993. By "GaInAsP" we mean $Ga_{1-x}In_xAs_{1-y}P_y$, with both x and y between 0 and 1. Frequently x and y are selected in known manner such that the GaInAsP is substantially lattice matched to InP, but use of non-lattice-matched GaInAsP is not precluded.

The lasers can be produced in conventional fashion, except that the inventive method of making the grating and growing semiconductor material thereon is substituted for any of the prior art methods. Since the conventional manufacturing steps are well known to those skilled in the art they do not require detailed recitation.

Furthermore, the inventive method can be practiced in known equipment, provided that the evacuable growth chamber comprises means for producing a phosphorus (P) flux (and typically also an arsenic (As) flux) from a solid source. Techniques for producing such fluxes from solid sources are known. See, for instance, J. N. Baillargeon et al., *Journal of Vacuum Science and Technology*, Vol. B 13(1), p. 64 (Jan./Feb. 1995). By "P flux" and "As flux" we do not imply any particular atomic or molecular species of the respective elements. Exemplarily, the fluxes frequently contain $P_2$ and $As_2$, respectively, as major components.

By way of example, we performed the grating modification and semiconductor growth in a commercially available (Riber 2300) MBE system that comprises a Riber model KPC 40 valved phosphorus cell (having three separately controllable temperature zones) and a third generation EPI model RB500VAs valved arsenic cell (having two temperature zones).

Figure 1:
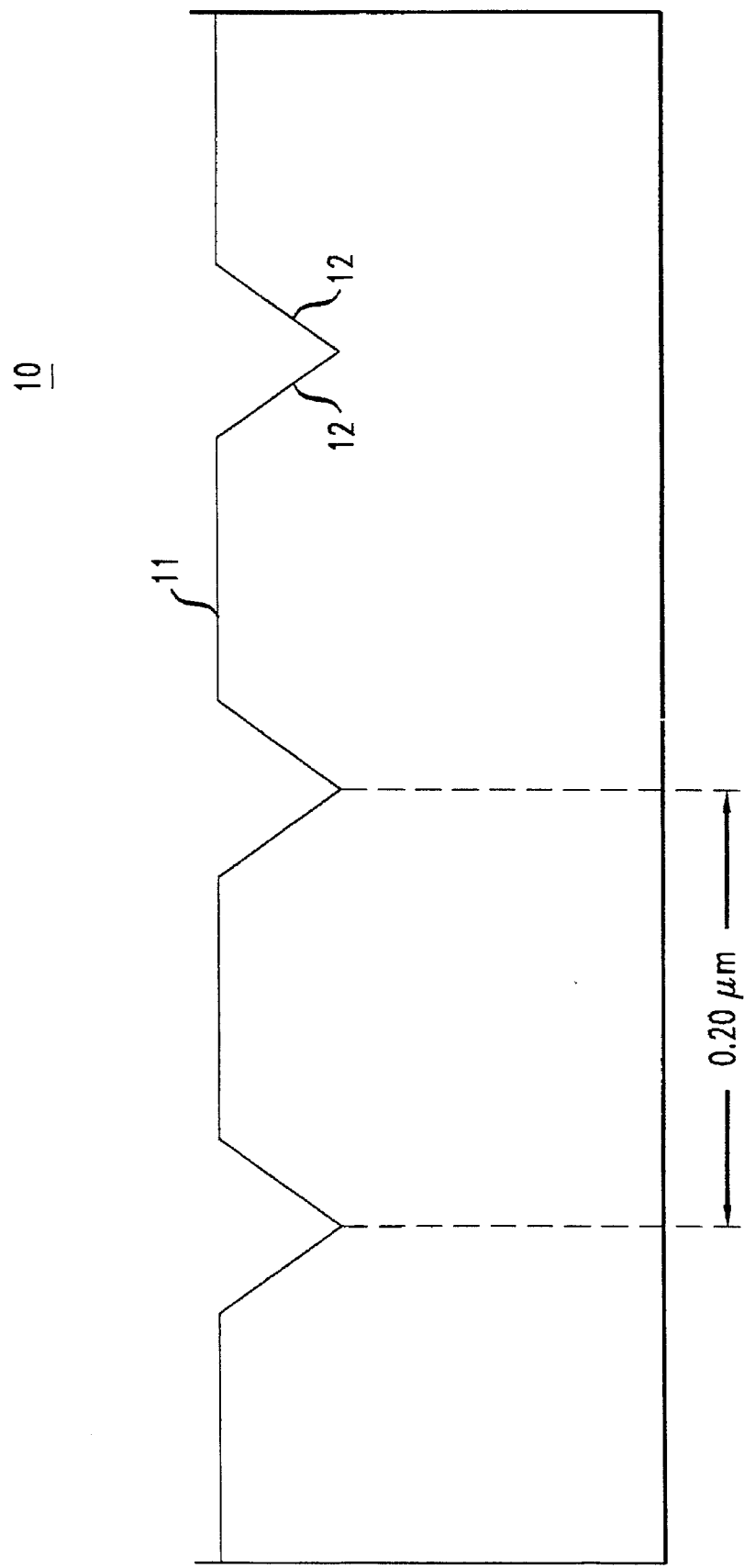
FIG. 1 is the representation of a cross-sectional transmission electron microscopy (TEM) micrograph of a DFB laser grating profile prior to mass transport and growth.

FIG. 1 substantially reproduces relevant features of a cross-sectional TEM micrograph of an exemplary grating 10 etched into a (100) surface 11 of an InP wafer. The grating periodicity was 0.201 μm, the grooves were oriented parallel to the [0$\bar{1}$1]direction, had (111)A side walls 12 and were about 60 nm deep. The grating was produced in conventional fashion, using holographic photolithography to pattern a conventional resist layer, followed by conventional wet chemical etching.

As can be seen from FIG. 1, the as-etched grating exhibits steep sidewalls and sharp corners. It is known that such features frequently cause strong localized composition shifts, which, in turn, can introduce large lattice strains. Thus, in order to reduce lattice strain and avoid the generation of dislocations, the grating profile desirably is smoothed, typically by thermally activated atom migration, prior to the initiation of overgrowth. This smoothing of the sharp grating features is referred to as mass transport, and we will herein use this terminology, regardless of the actual mechanism involved.

Figure 2:
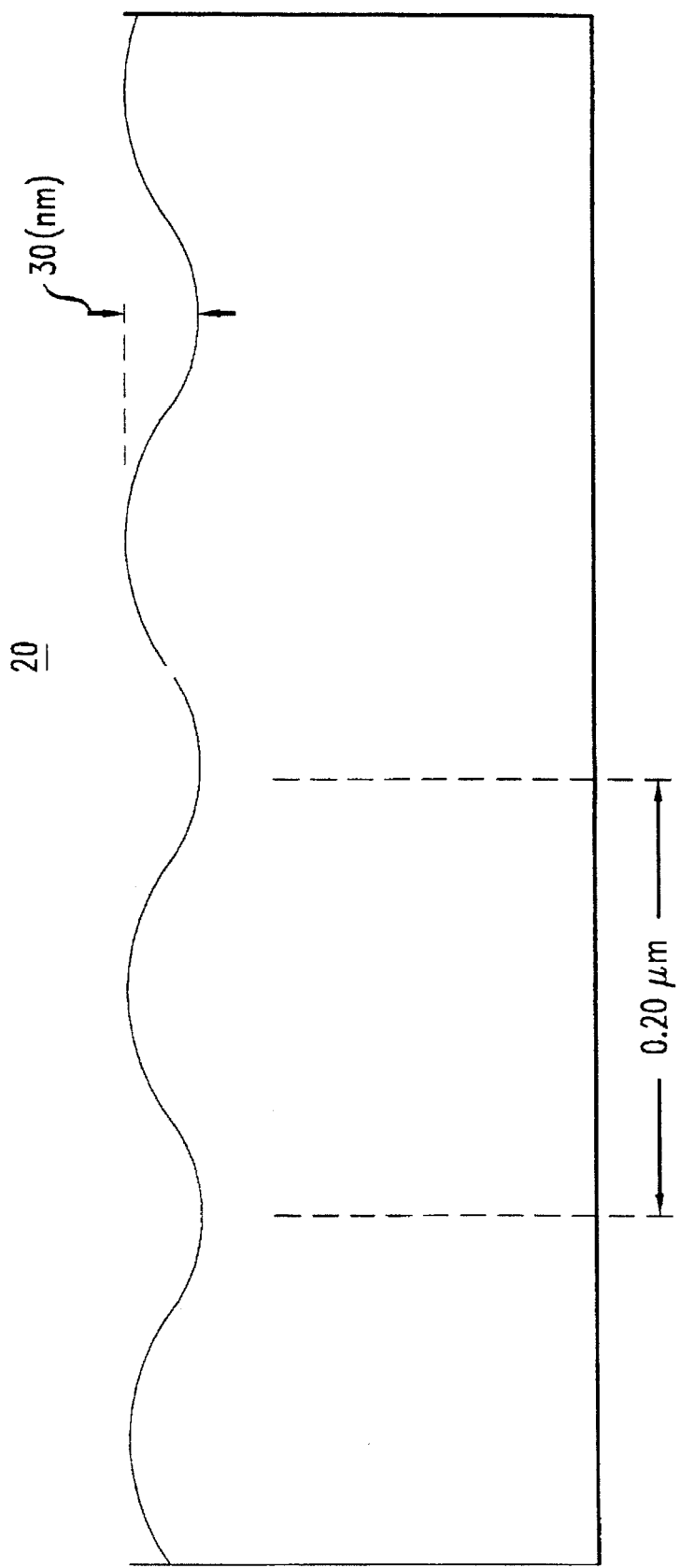
FIG. 2 is a representation of a cross-sectional micrograph of a grating profile after mass transport.

FIG. 2 is a cross-sectional scanning electron micrograph of an InP grating 20 after heating of a grating as shown in FIG. 1 at 480° C. for 5 minutes under a phosphorus flux (from a solid source) of $4\times10^{-6}$ Torr. The rounding of the sharp features is obvious. Grating depth was reduced to about 30 nm. Heating for periods longer than 5 minutes did not result in any significant further reduction of grating depth, but heating at 510° C. for 20 minutes substantially removed the grating. However, the mass transport rate is also a function of the phosphorus flux, in addition to being a function of temperature. Higher phosphorus flux can reduce the mass transport rate. For gratings in other III/V phosphorus-containing semiconductor materials (e.g., GaInAsP) appropriate mass transport temperatures may be somewhat different. Suitable mass transport temperatures are readily determined by minor experimentation.

We have discovered that heating of the grating in the presence of P and As fluxes from solid sources results in a reduced rate of mass transport, as opposed to heating in the presence of only P flux. Indeed, heating a InP grating of the type shown in FIG. 1 at 480° C. under an As flux, without P flux, did not result in significant smoothing of the grating. Thus, by appropriate choice of P and As fluxes, a desired rate of mass transport can be attained. Under combined phosphorus and arsenic fluxes mass transport exemplarily is carded out at a temperature in the range 460°–550° C. for 2–40 minutes. The fluxes exemplarily are in the range $1\times10^{-7}$–$1\times10^{-4}$ Torr. For example, a grating depth of about 40 nm can be preserved by heating the sample at 520° C. under $4\times10^{-6}$ Torr phosphorus flux and $0.7\times10^{-6}$ arsenic flux.

It should be noted that mass transport according to the invention typically occurs at substantially lower temperatures than does mass transport in the conventional (MOCVD) method. The latter typically occurs at temperatures above about 600° C. This difference of mass transport temperatures has implications for reproducibility and thus manufacturability, with lower temperatures generally providing better reproducibility.

It should also be noted that the mass transport treatment according to the invention results in thermal oxide desorption, and generally in generation of a substantially atomically clean surface. This is an important aspect of the inventive method which facilitates deposition of high quality overlayer material, provided the pristine surface condition is maintained up to coverage of the surface with overlayer material. This will be the case if the vacuum is maintained in the growth chamber, and if the time between completion of mass transport and commencement is suitably short, exemplarily less than 10 minutes.

Figure 3:
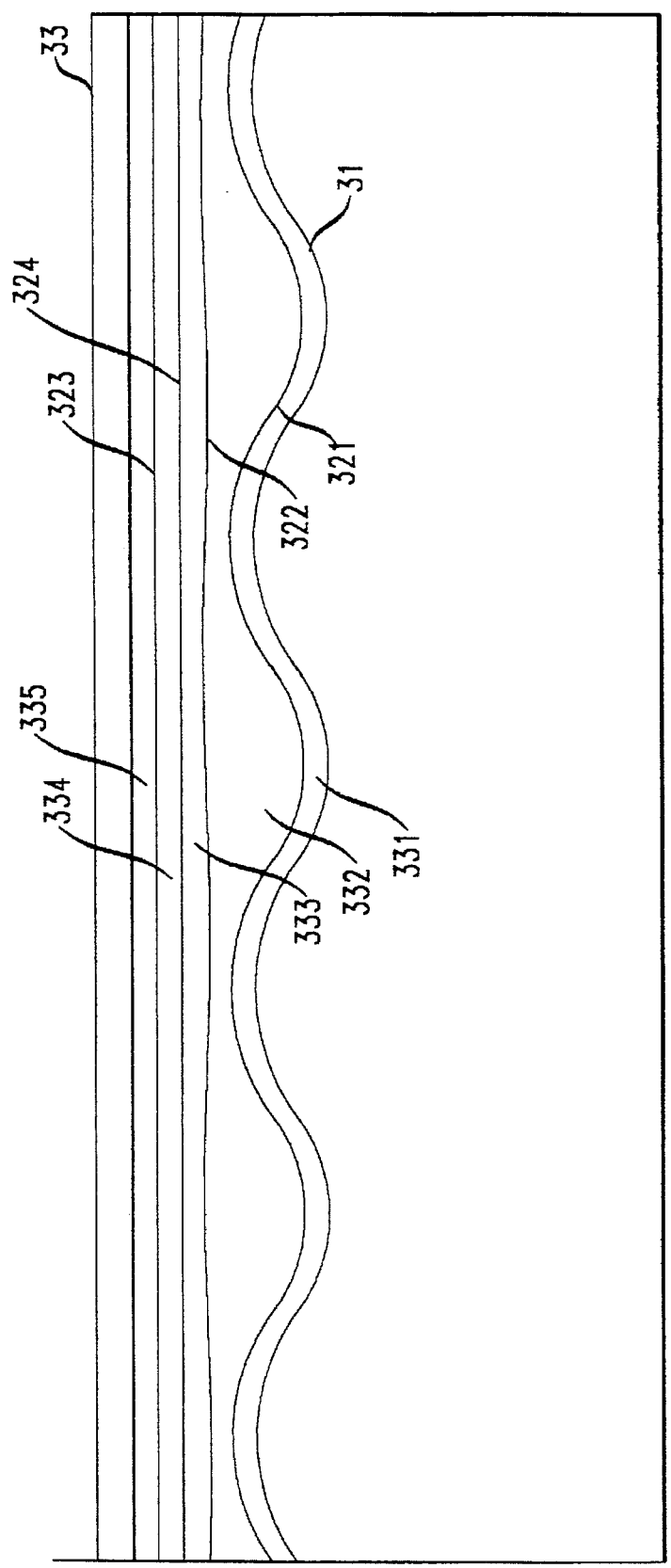
FIG. 3 is a representation of a cross-sectional micrograph of a sample with GaInAsP grown according to the invention on an Inp grating surface.

FIG. 3 is a representation of a cross-sectional TEM micrograph of a InP grating as shown in FIG. 2, with GaInAsP material grown on corrugated surface 31 of InP body 30. In order to show the progress towards planarity, 0.8 nm InP marker layers (321,322, 323, 324) were provided between 17 nm GaInAsP layers 331–335. Such markers typically would not be present in DFB lasers or other devices. Deposition was commenced immediately (within about one minute) after completion of the mass-transport heat treatment (480° C., P-flux $4\times10^{-6}$ Torr, 5 minutes). The fluxes were selected to yield quaternary material with emission wavelength in the range 1.17–1.20 μm. Ga and In were provided by elemental sources in known manner. Initial growth was carried out at 480° C., followed by a ramp-up to the final growth temperature of 530° C. The final temperature was reached before deposition of the second marker layer. Growth rates were 1.33 μm/h for the GaInAsP, and 0.57 μm/h for InP. Layer 33 is an InP layer provided to facilitate the TEM measurements.

As can be seen from FIG. 3, the second market layer is extremely smooth and already essentially planar, indicative of the ability of the inventive method to provide high quality planar overgrowth on a non-planar surface.

A further InP grating with GaInAsP overgrowth was produced as described above, except that the final growth temperature was 500° C. The lower growth temperature resulted in overgrowth of somewhat lower quality, with the third marker layer not being completely planar.

Exemplarily, the final growth temperature is in the range 480°–550° C., with temperatures above 500° C. being preferred. Samples grown according to the invention were generally free of growth-related dislocations, with samples grown at 530° C. generally exhibiting lower lattice strain than samples grown at 500° C. Photoluminescence (PL) measurements of GaInAsP grown on InP gratings and planar InP indicate that the quality of the former is comparable to that of the latter.

As those skilled in the art will recognize, the above-described method can be readily incorporated into a conventional process of manufacturing InP-based DFB lasers, with process steps that precede the mass-transport treatment, as well as process steps that follow deposition of the overgrowth material, being conventional. In view of the conventional nature of these steps, they do not require description.

The invention claimed is:

1. Method of making an indium phosphide-based III/V semiconductor device comprising
   a) providing a III/V semiconductor body having a major surface;
   b) patterning the major surface such that non-planar surface features are formed;
   c) growing a phosphorus-containing III/V semiconductor material on the patterned major surface; and
   d) carrying out one or more further steps towards completion of the device;

CHARACTERIZED IN THAT the method further comprises
   e) heating, in a substantially evacuated chamber, the semiconductor body to a mass-transport temperature and exposing, in the substantially evacuated chamber, the patterned major surface to a flux of at least phosphorus from a solid phosphorus flux source for a time effective for providing a shape change of the non-planar surface features by mass-transport; and
   f) carrying out step c) without exposing the semiconductor body to an ambient atmosphere, with the semiconductor body being at a first growth temperature not larger than said mass-transport temperature during at least an initial portion of step c).

2. Method of claim 1, wherein the phosphorus-containing III/V semiconductor material is selected from the group consisting of InP and the ternary and quaternary indium- and phosphorus-containing III/V semiconductor materials.

3. Method of claim 2, wherein the non-planar surface features are formed in InP and the phosphorus-containing III/V semiconductor material is InGaAsP.

4. Method of claim 1, wherein during step e) the patterned major surface is furthermore exposed to a flux of arsenic from a solid arsenic flux source, the fluxes of phosphorus and arsenic selected such that a desired rate of mass transport results.

5. Method of claim 1, wherein after said initial portion of step c) the temperature of the semiconductor body is raised to a second growth temperature above the first growth temperature.

6. Method of claim 5, wherein the second growth temperature is in the range 480°–550° C.

7. Method of claim 1, wherein the mass-transport temperature the range 460°–550° C.

8. Method of claim 1, wherein the indium phosphide-based III/V semiconductor device is a semiconductor laser, and the non-planar surface features are selected to form a Bragg grating.

9. Method of claim 1, wherein a background pressure in the substantially evacuated chamber is less than or equal to $10^{-8}$ Torr.

* * * * *